US011428740B2

(12) United States Patent
Chang et al.

(10) Patent No.: US 11,428,740 B2
(45) Date of Patent: Aug. 30, 2022

(54) INFORMATION HANDLING SYSTEM CAPACITIVE SENSING GAUGE AND INDICATOR

(71) Applicant: Dell Products L.P., Round Rock, TX (US)

(72) Inventors: Ching Wei Chang, Cedar Park, TX (US); Jeffrey D. Kane, Austin, TX (US); Allen B. McKittrick, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 329 days.

(21) Appl. No.: 16/844,148

(22) Filed: Apr. 9, 2020

(65) Prior Publication Data

US 2021/0318381 A1    Oct. 14, 2021

(51) Int. Cl.
*G01R 31/36*    (2020.01)
*G06F 3/044*    (2006.01)

(52) U.S. Cl.
CPC ......... *G01R 31/3646* (2019.01); *G06F 3/044* (2013.01)

(58) Field of Classification Search
None
See application file for complete search history.

(56) References Cited

U.S. PATENT DOCUMENTS

| | | |
|---|---|---|
| 6,429,625 B1 | 8/2002 | LeFevre et al. |
| 9,351,237 B2 | 5/2016 | Selim |
| 9,496,793 B2 | 11/2016 | Bruwer et al. |
| 9,559,536 B2 | 1/2017 | Brockman et al. |
| 9,985,323 B2 | 5/2018 | Hendren et al. |

*Primary Examiner* — Stephen T. Reed
(74) *Attorney, Agent, or Firm* — Zagorin Cave LLP; Robert W. Holland

(57) ABSTRACT

A battery charge state indicator presents an information handling system battery charge state with an illumination element at a housing side surface in response to end user proximity detected at both first and second capacitive sensor electrodes disposed at the side surface. The capacitive sensor electrodes are supported at a nonconductive material, such as a plastic palm rest covered by carbon fiber material, to provide a proximity detection path, and are grounded to an outer surface of the information handling system housing to reduce false detection induced by end user grasp of the information handling system housing.

20 Claims, 7 Drawing Sheets

INFORMATION HANDLING SYSTEM CAPACITIVE SENSING GAUGE AND INDICATOR

BACKGROUND OF THE INVENTION

Field of the Invention

The present invention relates in general to the field of portable information handling systems, and more particularly to an information handling capacitive sensing gauge and indicator.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source, such as a battery, in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that rotationally couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility. In some convertible systems, both housing portions have a display so that one of the displays presents a virtual keyboard. In some systems, a single OLED display may be disposed over both housing portions to fold about the hinge when the information handling system closes.

Battery storage capacity and battery charge state are typically of concern to end users when taking a portable information handling system for mobile use. In many instances, an end user picks up an information handling system for mobile use without knowing the battery charge state and without having time to turn the system on to check the battery charge. Often, an end user will use an information handling system with greater care about power consumption if the end user knows the system has a low battery charge. However, starting an information handling system by itself consumes a good deal of power so that an indication to an end user about a battery state with the information handling system in an off state can be beneficial to management of battery charge by the end user. Some portable information handling systems sold by DELL have included a discrete push button located along the side of the system housing that initiates a battery charge state check with a presentation of battery charge state at the housing outer surface during press of the button. Placing a battery check button at the outer surface of the housing creates some difficulties with system ID and aesthetics. For instance, end users have trended towards lighter weight and thinner information handling systems with a sleek and clean appearance that does not have room at the side of the housing for a push button.

SUMMARY OF THE INVENTION

Therefore, a need has arisen for a system and method which presents information handling system battery charge state in response to an end user touch at a housing.

In accordance with the present invention, a system and method are provided which substantially reduce the disadvantages and problems associated with previous methods and systems presenting information handling system battery charge state in response to a housing touch. A capacitive sensor disposed at a side surface of the information handling system detects an end user touch indicative of a request to present battery charge state and, in response, indicates the battery charge state with an illumination element disposed and visible at the housing side surface.

More specifically, an information handling system processes information with processing components disposed in a housing, such as processor and memory powered with a battery disposed in the housing. The housing has first and second housing portions rotationally coupled by a hinge to rotate between closed and open positions. A battery charge indicator is disposed along one side of the housing opposite the hinge and interfaced with a battery charger to present a visual indication of the battery charge state, such as with the housing in a closed state and the processor powered down. For instance, the battery charge indicator includes a capacitive sensor having first and second capacitive sensor electrodes extending along the housing side with a detection path directed towards the housing side by nonconductive material, such as a plastic and/or carbon fiber palm rest. The capacitive sensor commands indication of battery charge state by the illumination element, such as set of light emitting diodes, in response to detection of end user proximity at both capacitive sensor electrodes. The capacitive sensor grounds to a conductive cover at the housing surface to aid in distinguishing touches at the housing surface from touches at the housing side along the capacitive detection path defined by the nonconductive material.

The present invention provides a number of important technical advantages. One example of an important technical advantage is that an end user may determine an information handling system battery charge state with a touch to the system housing while the system remains powered down and in a closed state. A capacitive touch sensor disposed proximate the housing senses for a touch that commands presentation of battery charge state without exposing a push button or other moving part at the housing surface so that the system's appearance is minimally impacted by inclusion of the battery indicator. The capacitive touch sensor provides a low power and always-on solution to provide an end user with battery charge state information while the information handling system is powered down and, in an embodiment having rotationally-coupled housing portions, when the housing is in a closed position.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A battery charge indicator disposed at an information handling system side surface presents a battery charge indication in response to an end user touch detected at one or more capacitive touch sensor electrodes. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
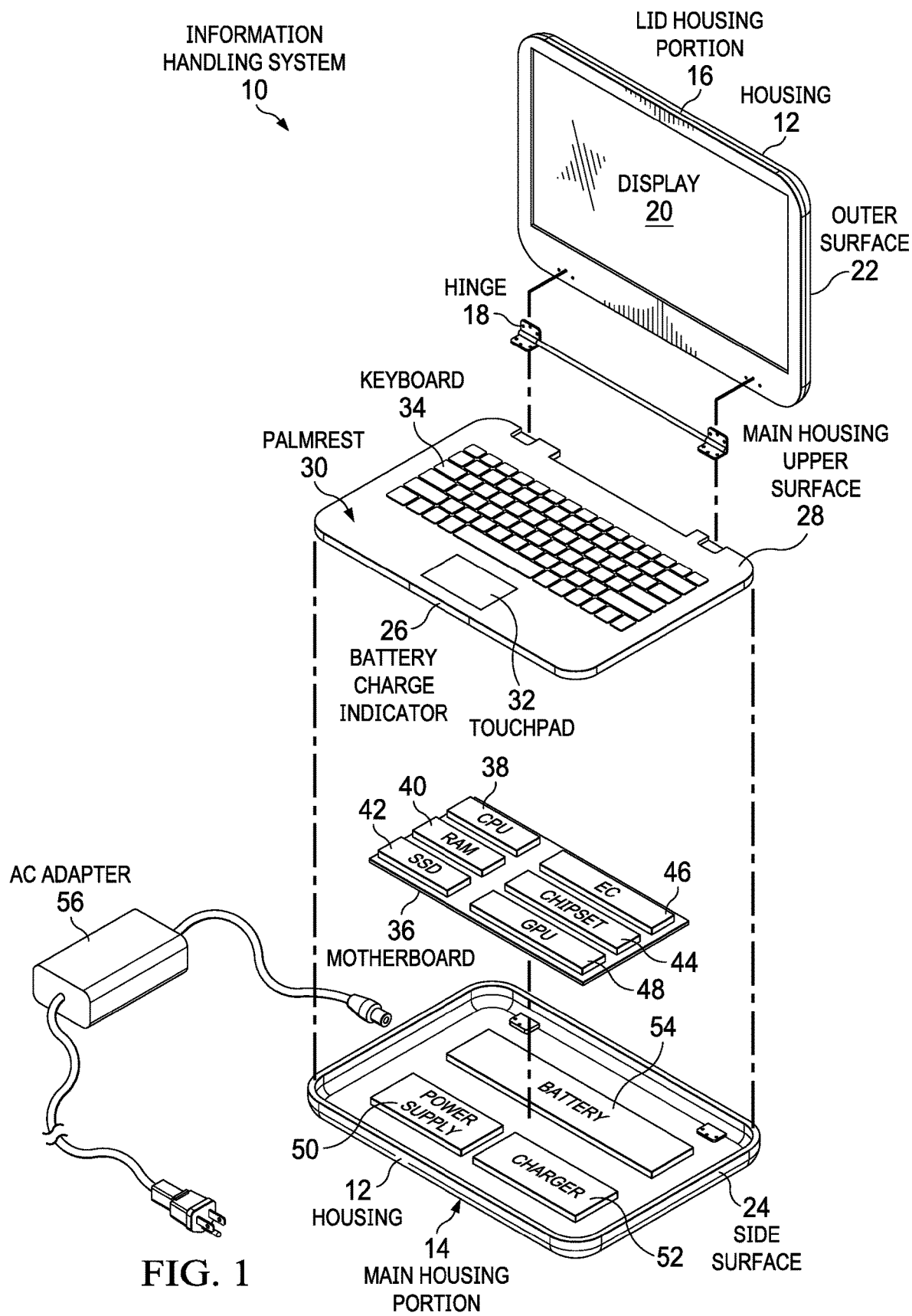
FIG. 1 depicts an exploded view of an information handling system having a battery charge indicator disposed at a housing side surface.

Referring now to FIG. 1, an exploded view depicts an information handling system 10 having a battery charge indicator 26 disposed at a housing 12 side surface 24. In the example embodiment, information handling system 10 has a portable "clamshell" configuration with housing 12 having a main portion 14 and lid portion 16 rotationally coupled by a hinge 18 to rotate between closed and open positions. Lid housing portion 16 integrates a display 20 at an inner front surface and has a supporting outer surface 22 of a conductive material, such as stainless steel or aluminum. Main housing portion 14 provides an interior space for holding processing components that process information and has at least a portion of its outer surface built from conductive material. Battery charge indicator 26 is disposed along a side surface 24 of housing 12 at an intersection of main housing portion 14 and a main housing upper surface 28 that covers main housing 14. In the example embodiment, battery charge indicator 26 is disposed at a middle front position of side surface 24 and integrated in a palm rest 30 that supports an end user typing at keyboard 34 and includes a touchpad 32 to accept point inputs. In the example embodiment, battery charge indicator 26 is visible at the front side surface 24 of housing 12 when main housing portion 12 and lid housing portion 14 rotate to a closed position having display 20 over top of and proximate to keyboard 34. As is described below in greater detail, an end user touch at battery charge indicator 26 with housing 12 closed indicates a battery charge state at an illumination element visible to the end user. In alternative embodiments, battery charge indicator 26 may be incorporated in other types of information handling system housings, such as along the side of a planar tablet housing.

In the example embodiment, processing components disposed in housing 12 cooperate to present information as visual images at display 20. For instance, a motherboard 36 interfaces a central processing unit (CPU) 38 that executes instructions to process information with a random access memory (RAM) 40 that stores the instructions and information. A solid state drive (SSD) 42 provides persistent storage of instructions and information, such as an operating system and applications that are retrieved to CPU 38 and RAM 40 for processing. A chipset 44 interfaces with CPU 38 to control processing constraints, such as clock speed and memory transfers. An embedded controller 46 executes firmware embedded code stored in flash memory to manage operating constraints of information handling system 10, such as power distribution and thermal management. A graphics processor unit (GPU) 48 interfaces with CPU 38 to process information into pixel values for presentation at display 20. In the example embodiment, the processing components are powered by a power supply 50 with an internal battery power source 54 or an external AC adapter power source 56 when external power is available. In the example embodiment power supply 50 and charger 52 are shown as separate elements, however either and/or both may be included on motherboard 36. Embedded controller 46 interfaces with power supply 50 and charger 52 to manage application of power to the processing components and charge state of battery 54. For example, in various embodiments, battery 54 may charge and discharge with external power applied as power consumed by the processing components varies. Battery charge indicator 26 may interface with charger 52 directly and/or through embedded controller 46 to retrieve the battery charge state for presentation in response to an end user touch as described below. In one embodiment, the battery charge state is stored locally at flash memory of battery charge indicator 26 for presentation when information handling system 10 is powered down; alternatively, battery charge indicator 26 may retrieve a present value sensed by charger 52 when information handling system 10 is powered down.

Figure 2:
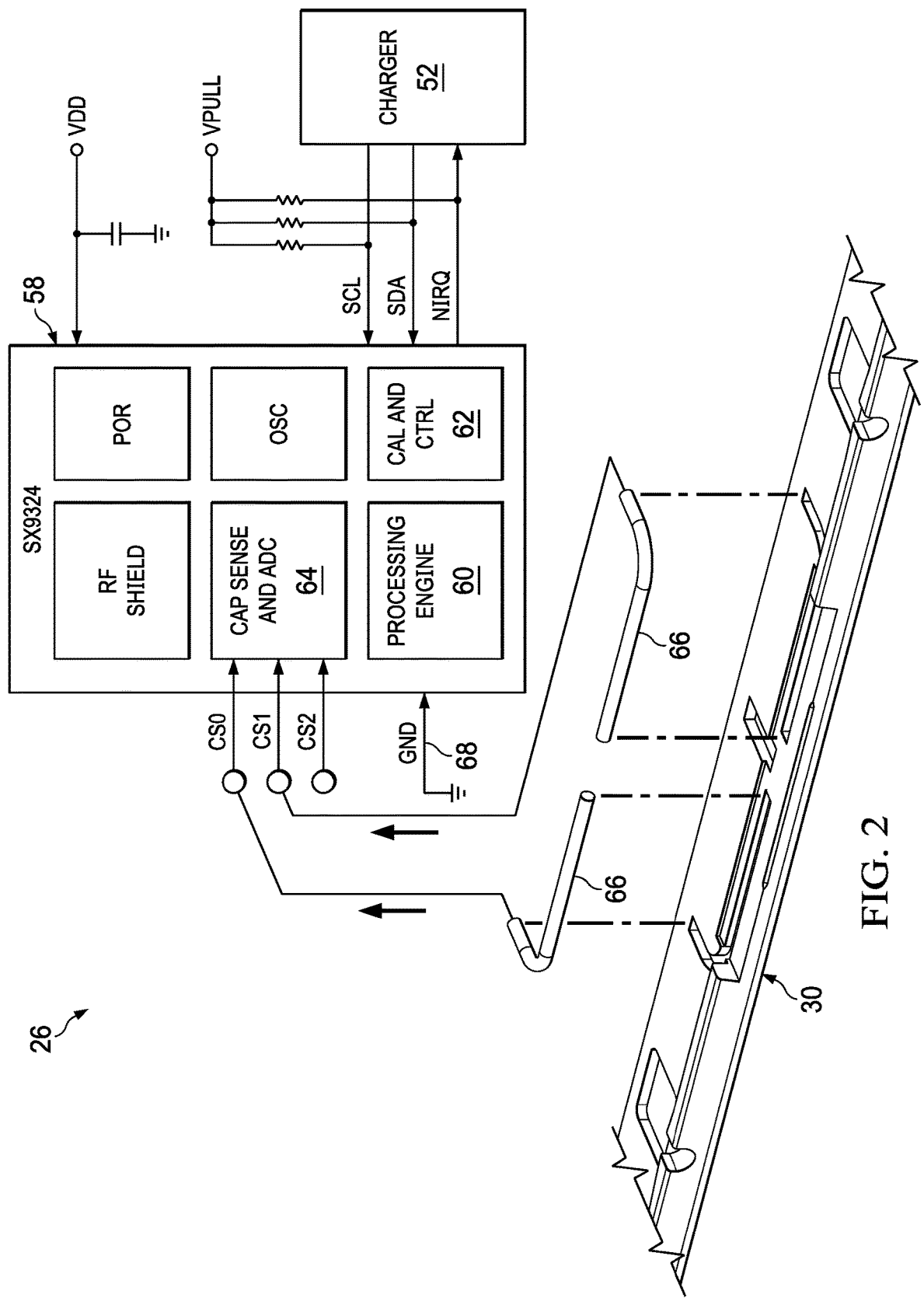
FIG. 2 depicts an example embodiment of a battery charge indicator.

Referring now to FIG. 2, an example embodiment of battery charge indicator 26 is depicted. In the example embodiment, a capacitive sensor 58 is provided by a SEMTECH SX9324 integrated circuit, although other types of integrated circuits may be used. Capacitive sensor 58 includes a processing engine 60 to execute instructions, a calibration and control engine 62 to maintain accurate capacitive sensing, and a capacitive sensing and ADC engine 64 to detect touches due to changes in capacitance at capacitive sensing electrodes 66. In the example embodiment, capacitive sensing electrodes 66 are metallic antenna integrated in a nonconductive material of palm rest 30, such as plastic part formed by a plastic injection mold. Each capacitive sensing electrode 66 interfaces with an input CS0 or CS1 of capacitive sensor 58 to provide a separate indication of end user proximity at each electrode. In the example embodiment, only when both electrode inputs indicate an end user proximity, processing engine 60 interfaces with charger 52 to retrieve a battery charge state for indication to an end user at an illumination element, as described in greater detail below. In order to provide improved capacitive sensing that distinguishes between incidental end user touches and touches in proximity to capacitive sensing electrodes 66, a ground 68 of capacitive sensor 58 couples to the outer surface of the information handling system 10. Ground 68 may couple through a shared ground with the system motherboard, however, a direct ground to the housing outer surface further improves sensing.

Figure 3:
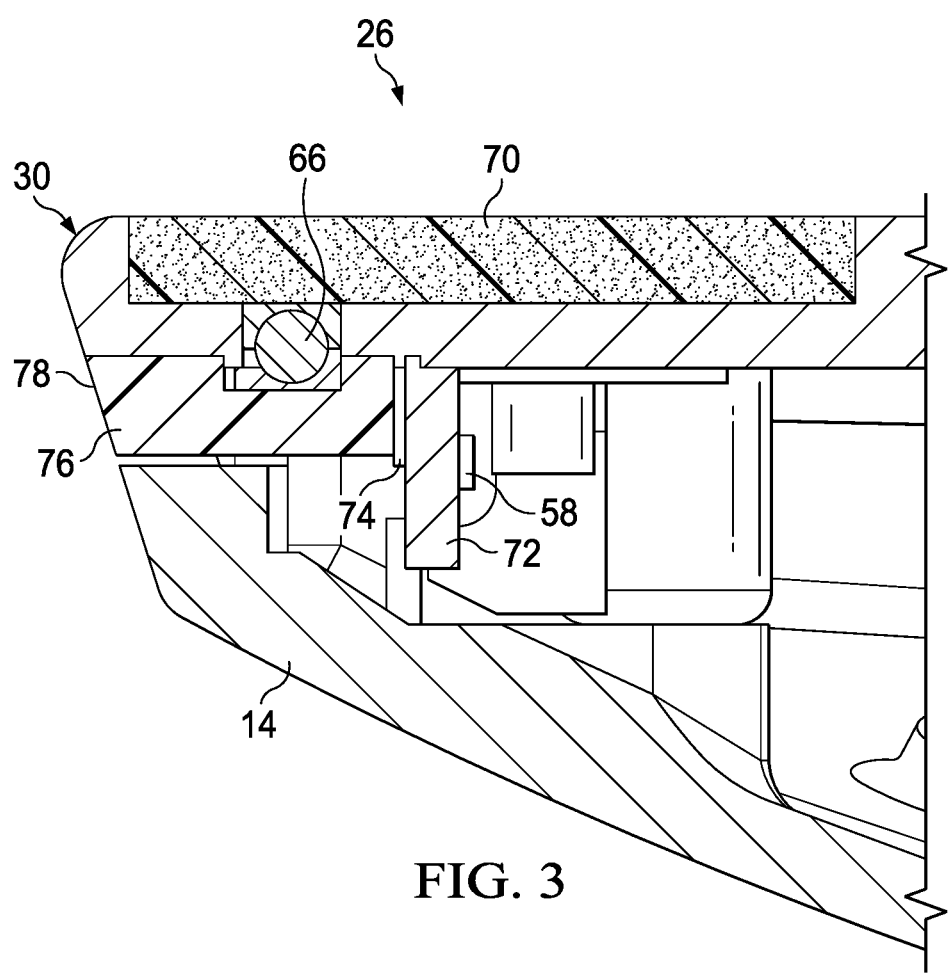
FIG. 3 depicts a side cutaway view of the capacitive sensor integrated in a palm rest with a nonconductive carbon fiber material disposed over capacitive sensor electrodes.

Referring now to FIG. 3, a side cutaway view depicts capacitive sensor 58 integrated in palm rest 30 with a nonconductive carbon fiber material 70 disposed over capacitive sensor electrodes 66. In the example embodiment, capacitive sensor 58 couples to a printed circuit board 72 captured in housing 14 and by palm rest 30. Capacitive sensor 58 executes embedded code on a processing engine to illuminate light emitting diodes (LEDs) 74 when proximity is detected at capacitive sensor electrodes 66. Printed circuit board 72 grounds directly to main housing portion 14 to provide improved sensitivity against false end user inputs related to touches by an end user against the housing. LEDs 74 illuminate through a light guide 76 to present illumination at the housing outer surface that indicates battery charge state. To initiate an output of the battery charge state, an end user touches at touch surface 78 along the side surface of main housing portion 14 to allow capacitance by the end user proximity to be measured at capacitive sensor electrode 66. In response to the end user proximity, capacitive sensor 58 retrieves battery charge state, such as from the system charger through a serial link, and commands illumination of LEDs 74 to present a visual representation of the battery charge state. For instance, battery charge state may be indicated by different colors at light guide 76 or different colors along the length of light guide 76.

In the example embodiment, capacitive sensing is enhanced by defining a capacitive sensing channel from capacitive sensor electrodes 66 towards touch surface 78. Carbon fiber material integrated in palm rest 30 over top of capacitive sensor electrodes 66 provides a natural absorption layer to block capacitive sensing of end user touches there with related false triggers while an end user is interfacing with the touchpad or keyboard. Direct grounding of capacitive sensor 58 to main housing portion 14 blocks unwanted false sensing when an end user places the information handling system against his body. For instance, with an aluminum main housing portion 12, the housing provides a reference ground plane for capacitive sensing reference calibration by coupling directly to the CSG ground of the proximity sensor. The mechanical relation of the capacitive sensor environment forces capacitance changes along the X-Y plane defined from the outer housing surface through light guide 76 to capacitive sensor electrodes 66.

Figure 4:
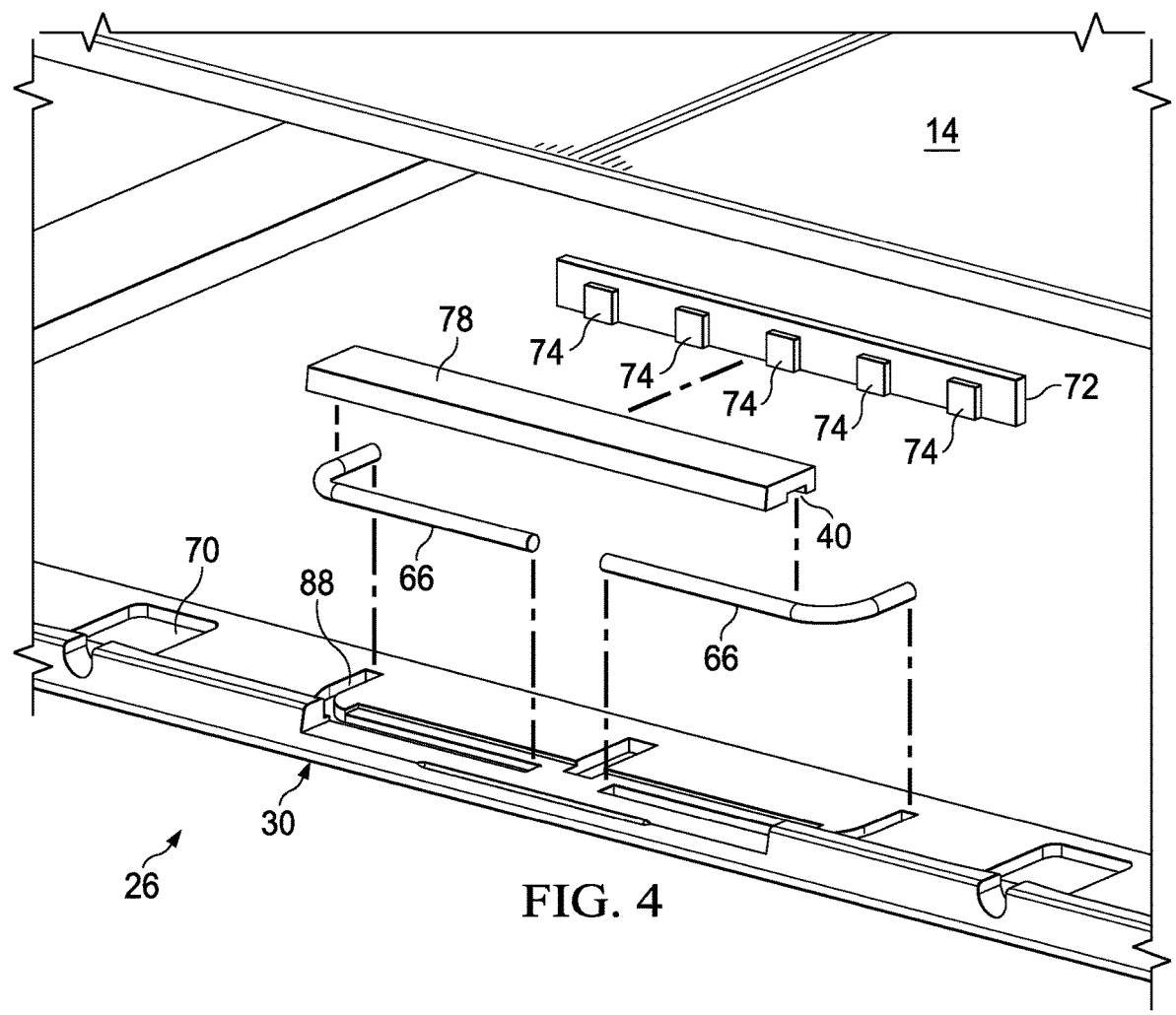
FIG. 4 depicts an exploded bottom perspective view of an example embodiment of the battery charge indicator.
Figure 5A:
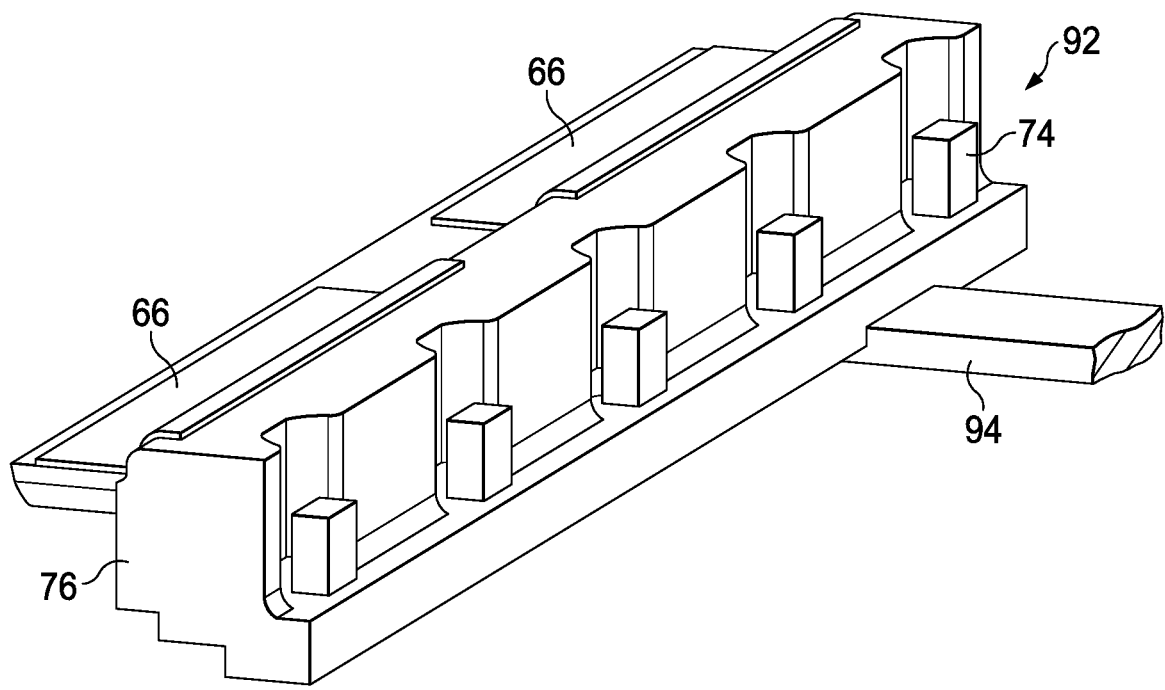
FIGS. 5A and 5B depict an alternative embodiment of the battery charge indicator.
Figure 5B:
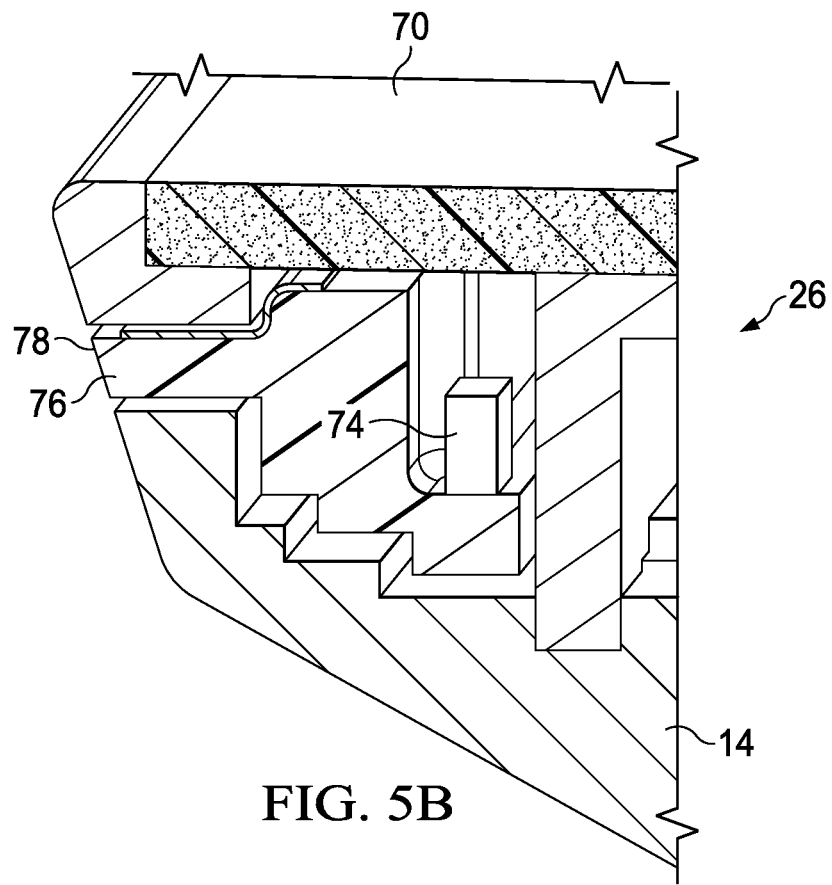

Referring now to FIG. 4, an exploded bottom perspective view depicts an example embodiment of battery charge indicator 26. Palm rest 30 includes first and second cavities 88 formed to accept first and second capacitive sensor electrodes 66. Light guide 78 captures capacitive electrode sensors 66 at the bottom surface of palm rest 30 with an outer face of light guide 78 aligned at the housing outer surface and an inner face of light guide 78 coupling to PCB 72 to accept illumination from LEDs 74. Carbon fiber material 70 couples to the upper surface of palm rest 30 so that capacitive sensor electrodes 66 integrate in palm rest 30 captured between carbon fiber material 70 and light guide 76, each of which manage capacitive sensing towards touch surface 78. The example embodiment illustrates an assembly that fits into main housing 12 to aid in ease of manufacture of information handling system 10. By disposing first and second capacitive sensor electrodes 66 along the side of palm rest 30, the presentation of illumination by LEDs 74 may require detection of end user proximity at both of the capacitive sensor electrodes 66 to reduce false positive battery charge state requests by incidental end user touches. For instance, a single finger may be placed along the entire length of light guide 76 so that both capacitive sensor electrodes 66 detect proximity with the LED illumination initiated for a timeout period, such as five seconds, after the loss of proximity detection indicates the finger is no longer obstructing the illumination. Alternatively, illumination may start at detection of proximity at both capacitive sensor electrodes 66 to indicate that the end user may move the finger with the timeout starting at detection of lack of proximity at finger removal.

Figure 6A:
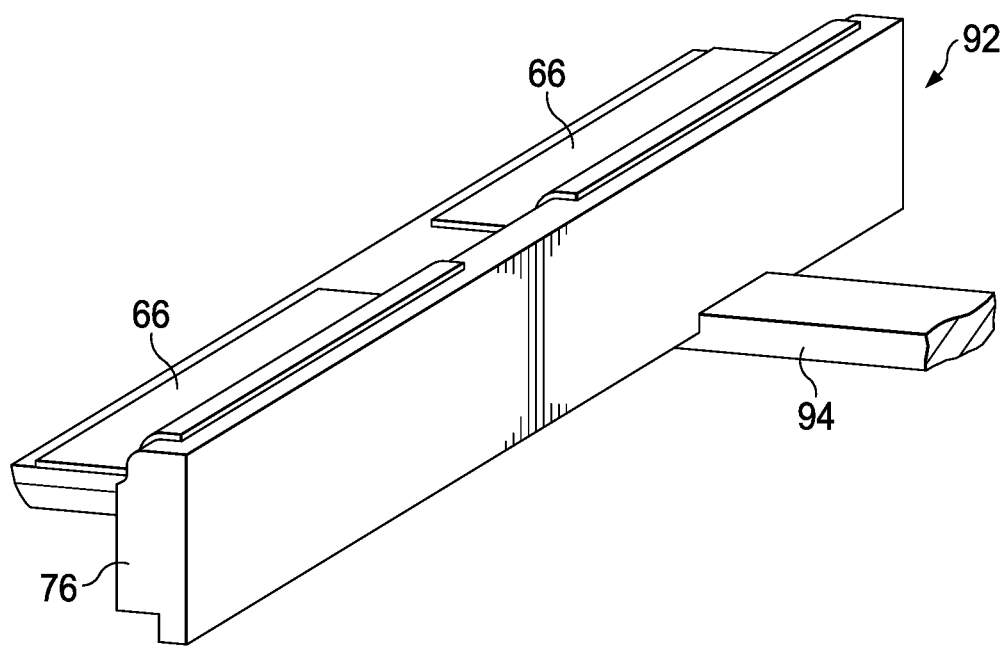
FIGS. 6A and 6B depict another alternative embodiment of the battery charge indicator.
Figure 6B:
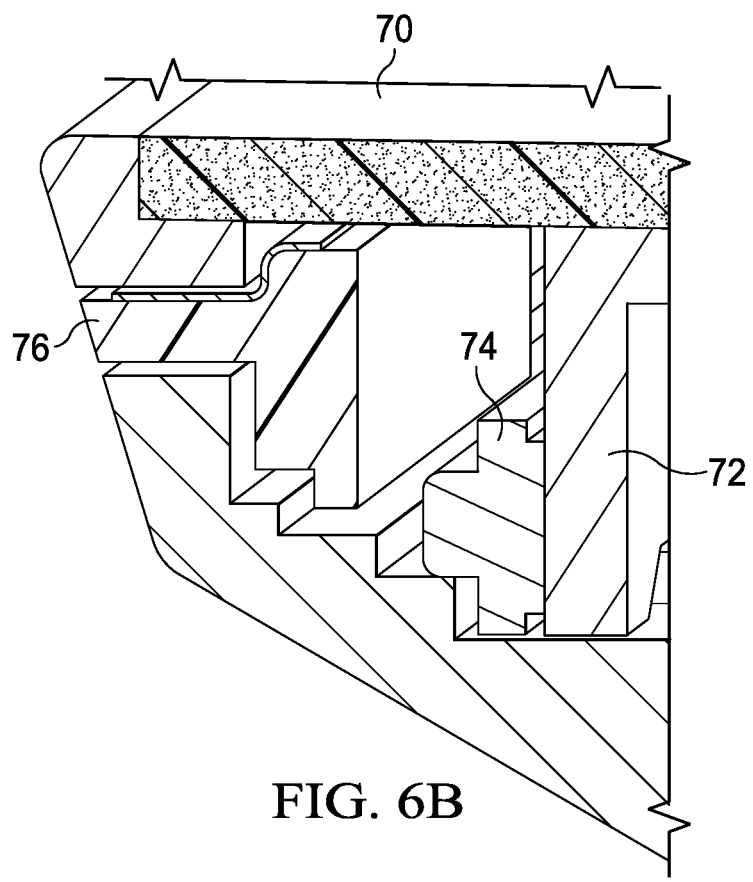
Figure 7A:
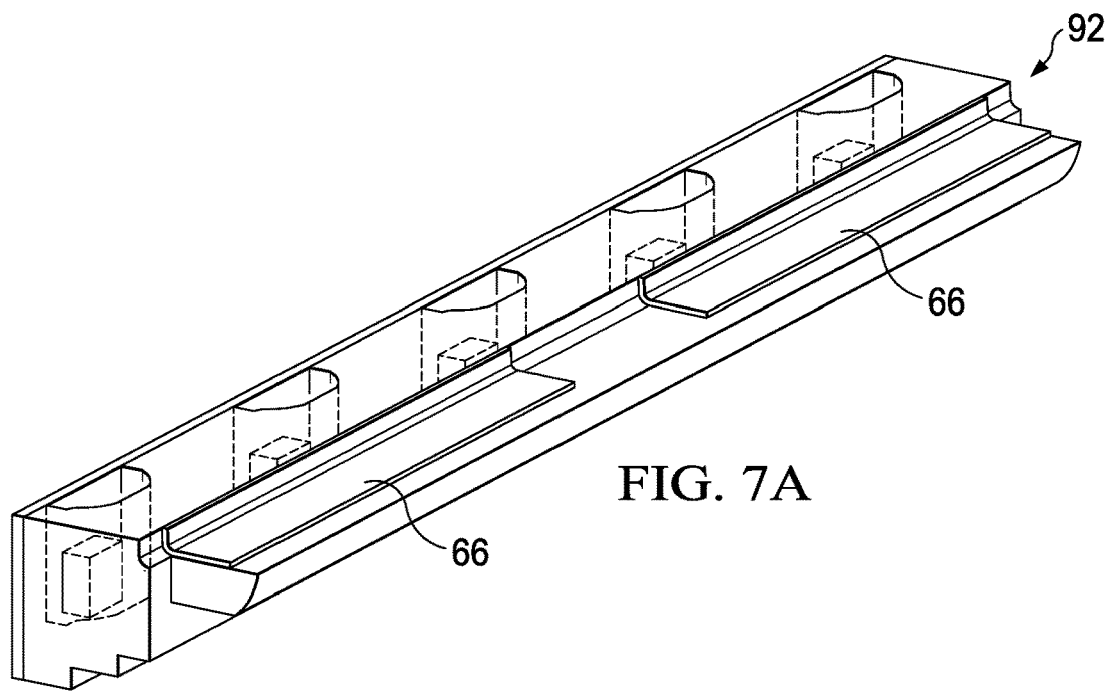
FIGS. 7A and 7B depict another alternative embodiments of the battery charge indicator.
Figure 7B:
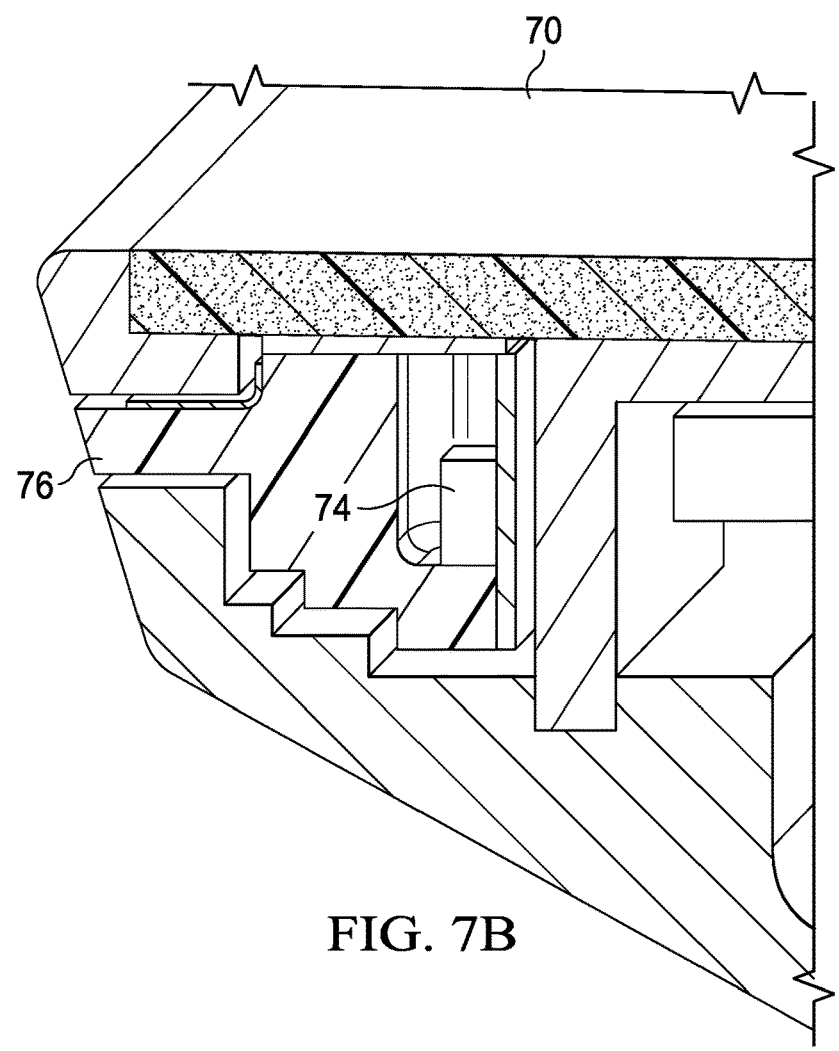

Referring now to FIGS. 5A and 5B, 6A and 6B, and 7A and 7B, alternative embodiments of battery charge indicator 26 are depicted. In the example embodiment of FIG. 5A, an illumination element 92 is built from a light guide 76 that integrates both LED's 74 powered by a flexible cable 94 and laser direct structures (LDS) that form the capacitive sensor electrodes 66. The illumination element 92 assembles as a complete unit that fits into main housing 14 under carbon fiber material 70. FIGS. 6A and 6B depict an example embodiment having a separate and discrete LED 74 light source that directs illumination into light guide 76. For example, LED 74 is an LED flexible printed circuit coupled to PCB 72 to obtain illumination power with flexible cable 94 interfacing with LDS capacitive sensor electrodes 66. FIGS. 7A and 7B depict an example embodiment having LEDs 74 coupled to light guide 76 with a flexible printed circuit 94 so that illumination is directed into light guide 76 towards LDS capacitive sensor electrodes. Other embodiments might include organic light emitting diode material (OLED) coupled to the light guide or LEDs exposed nearer the touch surface 78.

Although the present invention has been described in detail, it should be understood that various changes, substitutions and alterations can be made hereto without departing from the spirit and scope of the invention as defined by the appended claims.

What is claimed is:

1. An information handling system comprising:
   a housing;
   a processor disposed in the housing and operable to execute instructions that process information;
   a memory interfaced with the processor and operable to store the instructions and information;
   a battery disposed in the housing and interfaced with the processor and memory to provide power for the processor and memory;
   a power supply interfaced with the battery and operable to accept external power, the power supply selectively powering the processor and memory with the external power and battery;
   a charger interfaced with the power supply and operable to determine a charge state of the battery to selectively charge and discharge the battery based upon at least whether external power is available; and
   a battery charge state indicator disposed at a side surface of the housing and interfaced with the charger, the battery charge state indicator having a capacitive sensor to detect an end user touch and having illumination elements to indicate the charge state of the battery in response to the end user touch.

2. The information handling system of claim 1 further comprising:
   a metallic cover at a surface of the housing; and
   a ground from the metallic cover to the capacitive sensor.

3. The information handling system of claim 1 wherein the battery charge state indicator further comprises:
   a palm rest integrated in the housing and formed from nonconductive material, the palm rest having at least one electrode cavity proximate a side of the housing; and
   at least one capacitive sensor electrode disposed in the electrode cavity and interfaced with the capacitive sensor to detect end user proximity.

4. The information handling system of claim 3 wherein:
   the palm rest has first and second electrode cavities disposed along the side of the housing;
   the at least one capacitive sensor electrode comprises a first capacitive sensor electrode in the first electrode cavity and a second capacitive sensor electrode in the second electrode cavity, the first and second capacitive sensor electrodes interfaced with the capacitive sensor; and
   the capacitive sensor presents the battery charge state with the illumination elements only if both the first and second elements indicate end user proximity.

5. The information handling system of claim 4 further comprising carbon fiber material disposed over the first and second electrode cavities to capture the first and second capacitive sensor electrodes.

6. The information handling system of claim 4 wherein:
   the housing comprises first and second housing portions rotationally coupled by a hinge, the first housing portion integrating a keyboard and a touchpad, the second housing portion integrating a display; and
   the first and second capacitive sensor electrodes are disposed between the touchpad and the side of the main housing portion.

7. The information handling system of claim 6 wherein the first and second capacitive sensor elements comprise laser direct structures integrated with the illumination element.

8. The information handling system of claim 7 wherein the illumination element comprises:
   a light guide having a portion exposed at the side of the housing proximate the first and second capacitive sensor electrodes; and
   plural light emitting diodes integrated along a length of the light guide.

9. The information handling system of claim 7 wherein the illumination element comprises:
   a light guide having a portion exposed at the side of the housing proximate the first and second capacitive sensor electrodes; and
   plural light emitting diodes disposed proximate to and separate from the light guide.

10. A method for presenting a battery charge state at an information handling system, the method comprising:
    detecting a user proximity at a side of a housing of the information handling system with capacitive sensor;
    in response to the detecting, retrieving a battery charge state of a battery integrated in the information handling system; and
    in response to the retrieving, illuminating an illumination element at the side of the housing to indicate the battery charge state.

11. The method of claim 10 wherein the detecting further comprises:
    monitoring for user proximity with first and second capacitive sensor electrodes disposed at the side of the housing; and
    illuminating the illumination element only if both of the first and second capacitive sensor electrodes indicate user proximity.

12. The method of claim 11 wherein the first and second capacitive sensor electrodes comprise first and second laser direct structures integrated with the illumination element.

13. The method of claim 11 wherein the first and second capacitive sensor electrodes comprise first and second metallic members disposed in first and second cavities formed in a palm rest of the housing.

14. The method of claim 10 wherein:
    the information handling system housing has first and second housing portions rotationally coupled by a hinge, the housing having a conductive outer surface;
    the side of the housing at the capacitive sensor has a nonconductive material; and
    the capacitive sensor grounds to the conductive surface.

15. The method of claim 14 wherein the nonconductive material comprises:
    a plastic material supporting the capacitive sensor; and
    a carbon fiber material disposed over the plastic material and exposed at the housing as a palm rest.

16. The method of claim 15 wherein the illumination element comprises plural light emitting diodes coupled to the plastic material.

17. A system for presenting battery charge state at an information handling system housing, the system comprising:
    a nonconductive palm rest configured to integrate at an upper surface of an information handling system housing;
    a capacitive sensor integrated in the palm rest and having first and second electrodes disposed proximate a side surface of the information handling system housing; and
    an illumination element disposed at the side surface of the information handling system and interfaced with the capacitive sensor to illuminate indications of a battery charge state;

wherein the capacitive sensor illuminates the illumination element with the battery charge state in response to detection by capacitive sensing of end user proximity simultaneously at both the first and second electrodes.

18. The system of claim 17 wherein the first and second electrodes comprise first and second laser direct structures integrated in the illumination element.

19. The system of claim 17 wherein the nonconductive palm rest comprises carbon fiber material disposed over the first and second electrodes at the upper surface.

20. The system of claim 19 wherein the information handling system housing comprises a conductive outer surface and the capacitive sensor grounds to the conductive outer surface.

* * * * *